(12) United States Patent
Kamiya

(10) Patent No.: US 6,710,421 B2
(45) Date of Patent: Mar. 23, 2004

(54) SEMICONDUCTOR DEVICES AND METHODS FOR MANUFACTURING THE SAME

(75) Inventor: Toshiyuki Kamiya, Fujimi-machi (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 10/271,372

(22) Filed: Oct. 15, 2002

(65) Prior Publication Data

US 2003/0085443 A1 May 8, 2003

(30) Foreign Application Priority Data

Oct. 15, 2001 (JP) ........................................ 2001-316822

(51) Int. Cl.[7] .............................................. H01L 29/72
(52) U.S. Cl. ....................... 257/508; 257/510; 257/511; 257/514
(58) Field of Search ................................ 257/508, 510, 257/511, 514

(56) References Cited

U.S. PATENT DOCUMENTS 6,548,338 B2 * 4/2003 Bernstein et al. ............ 257/508
2002/0046880 A1 * 4/2002 Takubo et al. ............... 257/508

* cited by examiner

Primary Examiner—Edward Wojciechowicz
(74) Attorney, Agent, or Firm—Konrad Raynes & Victor, LLP; Alan S. Raynes

(57) ABSTRACT

A semiconductor device may include a first wiring layer 30, an interlayer dielectric layer 40 formed above the first wiring layer 30, a second wiring layer 50 formed above the interlayer dielectric layer 40, a through hole 60 formed in the second wiring layer 50 and the interlayer dielectric layer 40, and a contact layer 70 that is formed in the through hole 60 and electrically connects the first wiring layer 30 and the second wiring layer 50.

23 Claims, 4 Drawing Sheets

SEMICONDUCTOR DEVICES AND METHODS FOR MANUFACTURING THE SAME

Applicant hereby incorporates by reference Japanese Application No. 2001-316822, filed Oct. 15, 2001, in its entirety.

TECHNICAL FIELD

The present invention relates to semiconductor devices and methods for manufacturing the same, and includes semiconductor devices characterized by their contact layer and methods for manufacturing the same.

RELATED ART

As a technology for forming a contact layer that mutually connects wirings in different layers, for example, the following technology is known.

The technology is described with reference to FIG. 9. A first interlayer dielectric layer 212 is formed on a semiconductor substrate 210 where elements such as semiconductor elements are formed. A first conductive layer is formed on the first interlayer dielectric layer 212, and the first conductive layer is patterned by lithography technique and dry etching to form a lower wiring layer 220. A second interlayer dielectric layer 230 is formed on the lower wiring layer 220 and the first interlayer dielectric layer 212.

Then, a resist layer having a specified pattern is formed on the second interlayer dielectric layer 230. The resist layer has an opening section above a region where a through hole is to be formed. Using the resist layer as a mask, the second interlayer dielectric layer 230 is dry etched to form a through hole 240 that reaches the lower wiring layer 220.

Next, a conductive material is filled in the through hole 240, to form a contact layer 250. A second conductive layer is formed over the second interlayer dielectric layer 230 and the contact layer 250, and the second conductive layer is patterned by lithography technique and dry etching to form an upper wiring layer 260.

In the aforementioned technology, in order to lower and stabilize the contact resistance, some measures are taken before forming the contact layer to recover damages caused by the etching step conducted at the time of forming the through hole, to remove contamination with impurities such as heavy metal, carbon, oxygen and fluorine, to remove products of the etching, and the like. Methods to remove damaged layers caused by the etching and impurity contamination include a method in which the interior surface of the through hole is slightly oxidized to include these damage layers, and the oxides are etched; a method in which only the surface layer is slightly etched by a dry etching method using reactive gases; a method in which they are physically removed by a sputter etching method with gases such as argon gas.

SUMMARY

Certain embodiments relate to a semiconductor device including a first wiring layer and an interlayer dielectric layer formed above the first wiring layer. The device also includes a second wiring layer formed above the interlayer dielectric layer, and a through hole formed in the second wiring layer and the interlayer dielectric layer. A contact layer is formed in the through hole and electrically connects the first wiring layer and the second wiring layer.

Certain embodiments also relate to a method for manufacturing a semiconductor device, including: (a) forming a first wiring layer; (b) forming an interlayer dielectric layer above the first wiring layer; (c) forming a conductive layer above the interlayer dielectric layer; (d) forming a through hole in the conductive layer and the interlayer dielectric layer, wherein the through hole reaches the first wiring layer; (e) forming a contact layer in the through hole; and (f) patterning the conductive layer to form a second wiring layer.

Certain embodiments also relate to a semiconductor device including a first electrically conducting layer, an interlayer dielectric layer formed on the first electrically conducting layer, and a second electrically conducting layer formed on the interlayer dielectric layer. The device also includes a through hole extending through the second electrically conducting layer and the interlayer dielectric layer, and a third electrically conducting layer that is disposed in the through hole.

BRIEF DESCRIPTION OF THE DRAWINGS

Embodiments of the invention are described with reference to the accompanying drawings which, for illustrative purposes, are schematic and not necessarily drawn to scale.

DETAILED DESCRIPTION

Figure 9:
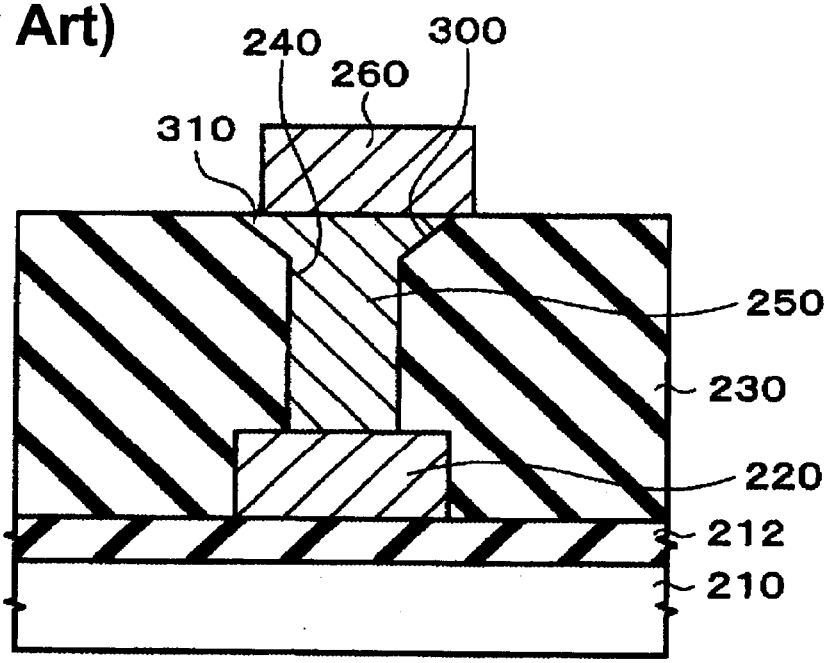
FIG. 9 schematically shows a cross section of a conventional semiconductor device.

When a sputter etching method with gases such as argon gas is used to remove the impurity contaminants inside the through hole, an upper end section of the through hole 240 is cut as shown in FIG. 9, such that a tapered side surface 300 is formed and therefore the diameter of the upper section of the through hole 240 becomes greater than the diameter of the lower section thereof. Then, when the contact layer 250 is embedded in the through hole 240 and then the upper wiring layer 260 is formed thereon, the contact layer 250 may have an exposed portion 310 which is not covered by the upper wiring layer 260. In particular, in miniaturized devices, pitches between wirings are small, and therefore the contact layer 250 having the exposed portion 310 may cause problems in the devices such as short circuits across adjacent wiring layers.

It is an object of certain embodiments of the present invention to provide semiconductor devices having highly reliable wiring layers and methods for manufacturing the same.

A semiconductor device in accordance with certain embodiments of the present invention includes a first wiring layer, an interlayer dielectric layer formed above the first wiring layer, a second wiring layer formed above the interlayer dielectric layer, a through hole formed in the second wiring layer and the interlayer dielectric layer, and a contact layer that is formed in the through hole and electrically connects the first wiring layer and the second wiring layer.

With the semiconductor device described above, the through hole is formed in the second wiring layer and the interlayer dielectric layer, which prevents the problem in that the contact layer embedded in the through hole would not be covered by the second wiring layer and exposed. This structure can prevent the problem in that the reliability of wiring layers would be harmed, for example, as a result of short circuits between the exposed portion of the contact layer and the wiring layers.

The semiconductor device described above may have embodiments exemplified below.

A side surface of the through hole formed in the interlayer dielectric layer may be continuous with a side surface of the through hole formed in the second wiring layer. In other words, the through hole may penetrate through the interlayer dielectric layer and the second wiring layer.

The contact layer may include a protruded section that protrudes higher from a top surface of the interlayer dielectric layer, and the contact layer and the second wiring layer may be electrically connected to each other through a side surface of the protruded section.

An upper surface of the contact layer and an upper surface of the second wiring layer may be generally continuous with each other.

At least one of a wetting layer and a barrier layer may be formed inside the through hole formed in the interlayer dielectric layer, and at least one of the wetting layer and the barrier layer may extend to a side surface of the through hole formed in the second wiring layer.

The contact layer and the second wiring layer may be electrically connected to each other through at least one of the wetting layer and the barrier layer.

The through hole may have a tapered side surface such that a diameter of an upper end section of the through hole is greater than a diameter of a lower section thereof, and further a side surface of the second wiring layer in contact with the second interlayer dielectric layer and at least portion of a side surface of the contact layer are generally continuous with each other.

A method for manufacturing a semiconductor device in accordance with certain embodiments of the present invention may include the following steps (a)–(f):

(a) forming a first wiring layer;
(b) forming an interlayer dielectric layer above the first wiring layer;
(c) forming a conductive layer above the interlayer dielectric layer;
(d) forming a through hole in the conductive layer and the interlayer dielectric layer, which reaches the first wiring layer;
(e) forming a contact layer in the through hole; and
(f) patterning the conductive layer to form a second wiring layer.

With the method for manufacturing a semiconductor device described above, the through hole that penetrates through the conduction layer and the interlayer dielectric layer is formed and, after embedding the contact layer therein, the second wiring layer is patterned. In other words, this can prevent the problem in that the contact layer would not be covered by the second wiring layer and exposed. The manufacturing method described above may have specific features set forth in embodiments exemplified below.

In the step (d), the through hole may be formed such that a side surface of the through hole formed in the conductive layer and a side surface of the through hole formed in the interlayer dielectric layer are continuous with each other. With this, the through hole that penetrates through the conductive layer and the interlayer dielectric layer may be formed.

The step (e) may include the step of forming a contact layer in the through hole and above the conductive layer, and before the step (f), the step (g) of removing the contact layer formed above the conductive layer may be included. Also, in the step (g), an upper surface of the contact layer and an upper surface of the second wiring layer may be formed to have about an identical height.

Before the step (e), the step (h) of forming at least one of a wetting layer and a barrier layer in the through hole formed in the interlayer dielectric layer may be included. Also, in the step (h), at least one of the wetting layer and the barrier layer may be formed to extend to a side surface of the through hole formed in the conductive layer.

Before the step (e), the step (i) of etching the through hole to form a taper on the side surface of the through hole may be included such that a diameter of an upper end section of the through hole is greater than a diameter of a lower section thereof. With this etching, impurity contaminants in the through hole can be removed.

Certain embodiments of the present invention are described below with reference to the accompanying drawings.

Figure 1:
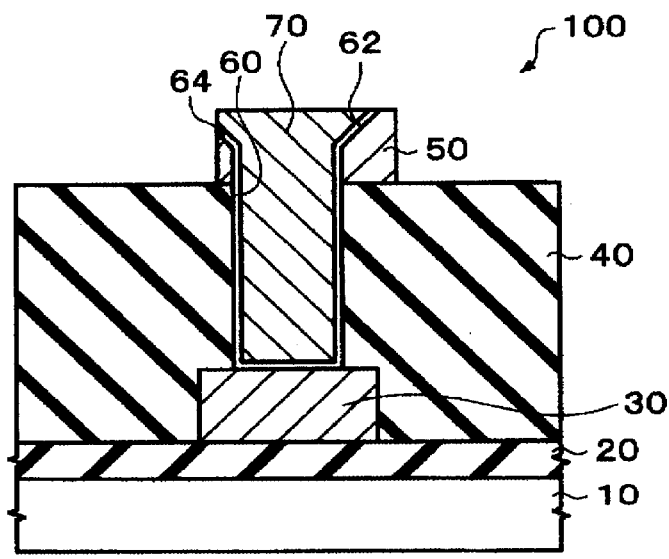
FIG. 1 schematically shows a cross-sectional view of a semiconductor device in accordance with an embodiment of the present invention.
Figure 2:
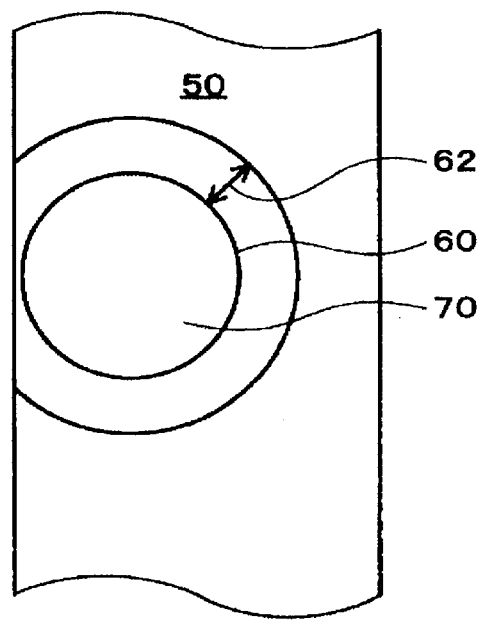
FIG. 2 schematically shows a plan view of the semiconductor device in accordance with the embodiment of the present invention illustrated in FIG. 1.

A semiconductor device 100 in accordance with the present embodiment is described. FIG. 1 schematically shows a cross-sectional view of the semiconductor device 100 in accordance with the present embodiment. FIG. 2 schematically shows a plan view of a second wiring layer 50 of the semiconductor device 100 in accordance with the present embodiment.

Semiconductor elements such as MOSFETs, wiring layers and element isolation regions (not shown) may be formed on a surface of a substrate 10 of the semiconductor device 100. A first interlayer dielectric layer 20 is formed on the substrate 10. A first wiring layer 30 having a specified pattern is formed on the first interlayer dielectric layer 20. Through holes (not shown) are formed in the first interlayer dielectric layer 20 that connect the semiconductor elements or wiring layers formed on the surface of the substrate 10 to the first wiring layer 30. Contact layers (not shown) such as tungsten plugs, aluminum alloy layers or the like are formed in the through holes.

A second interlayer dielectric layer 40 is formed on the first wiring layer 30 and the first interlayer dielectric layer 20, and a second wiring layer 50 is formed on the second interlayer dielectric layer 40. A through hole 60 that is continuous with the first wiring layer 30 is formed in the second wiring layer 50 and the second interlayer dielectric layer 40 at a specified location. The through hole 60 has a side surface formed in the second interlayer dielectric layer 40 and a side surface formed in the second wiring layer 50 which are continuous with each other, and is formed to penetrate through the second interlayer dielectric layer 40 and the second wiring layer 50.

A contact layer 70 such as a tungsten plug, an aluminum alloy layer or the like is formed inside the through hole 60, and the contact layer 70 has a protruded section that protrudes from the upper surface of the second interlayer dielectric layer 40. The contact layer 70 and the second wiring layer 50 are electrically connected to each other through the protruded section. The upper surface of the contact layer 70 and the upper surface of the second wiring layer 50 are preferably disposed at approximately the same height.

A wetting layer and a barrier layer 64 are formed inside the through hole 60 that is formed in the second interlayer dielectric layer 40, and are also formed to be continuous with the side surface of the through hole 60 that is formed in the second wiring layer 50. The contact layer 70 and the second wiring layer 50 are electrically connected to each other through the wetting layer and the barrier layer 64.

Also, the through hole 60 has a tapered side surface 62 such that it has a structure in which the diameter of the upper end section thereof is larger than the diameter of the lower section thereof.

Furthermore, a part of the contact layer 70 in the illustrated example is patterned at the same time when a patterning is conducted to form the second wiring layer 50. The side surface of the second wiring layer 50 and a part of the side surface of the contact layer 70 are in electrical contact through the wetting layer and barrier layer 64. As shown in FIG. 2, the through hole 60 has the tapered side surface 62 at its upper end section to have a structure that is wider than the diameter of the lower section thereof, but a part of the wider section is removed when the second wiring layer 50 is patterned.

The following can be said for the characteristic features of the semiconductor device 100 in accordance with the present embodiment.

(1) The through hole 60 that is formed for electrically connecting the second wiring layer 50 and the first wiring layer 30 is formed to penetrate through the second wiring layer 50 and the second interlayer dielectric layer 40.

(2) The through hole 60 has the tapered side surface 62 such that the diameter of the upper section of the through hole 60 is greater than the diameter of the lower section thereof.

(3) Even when a part of the contact layer 70 is formed in an area other than the region of the second wiring layer 50, this part can be removed when the second wiring layer 50 is patterned, and therefore the contact layer 70 does not have any exposed portion on the second interlayer dielectric layer 40.

Next, a method for manufacturing the semiconductor device 100 in accordance with an embodiment of the present invention is described. FIGS. 3–7 schematically show in cross sections the steps for manufacturing the semiconductor device 100 in accordance with the present embodiment.

(1) Formation of First Wiring Layer

Figure 3:
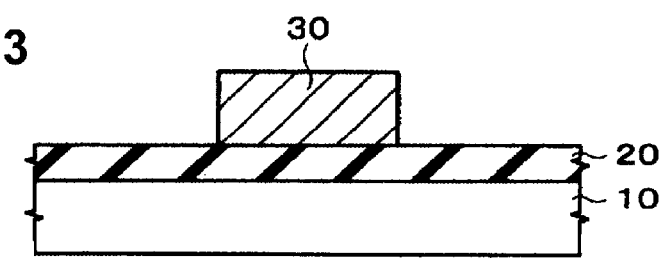
FIG. 3 schematically show in cross section a step for manufacturing the semiconductor device in accordance with an embodiment of the present invention.

First, descriptions are made with reference to FIG. 3. By an ordinary method, semiconductor elements (for example, MOSFETs), wiring layers and element isolation regions (not shown) are formed on a surface of a substrate 10. A first interlayer dielectric layer 20 is formed on the substrate 10. Details (forming method, material, film thickness) of the first interlayer dielectric layer 20 are the same as those of a second interlayer dielectric layer 40 to be described below. Contact holes (not shown) are formed in the first interlayer dielectric layer 20 by an anisotropic reactive ion etching (RIE) method. By a known method, contact layers such as tungsten plugs, aluminum alloy layers or the like (not shown) are formed in the contact holes.

A first wiring layer 30 is formed on the first interlayer dielectric layer 20 and the contact layers, for example, in the following manner.

First, a conductive layer is formed on the first interlayer dielectric layer 20 and the contact layers. The conductive layer may have a stacked layered structure including material such as titanium nitride, Al—Cu and titanium nitride layers with their film thickness being about 25 nm, about 250 nm and about 25 nm, respectively. The film thickness of the first conductive layer may differ depending on the device design, but may preferably be 100–1000 nm, for example. The material of the conductive layer is not particularly limited, but may preferably be a single layer of aluminum, copper, aluminum alloy, copper alloy, polysilicon, tungsten, titanium nitride or the like, or a stacked layered film including the aforementioned layers. For example, the conductive layer may be formed by a CVD method, a sputter method, a vacuum deposition method, a coating method or the like.

Next, a resist layer having a specified pattern is formed on the conductive layer by a lithography technique. Then, a pattern forming is conducted by dry etching. As an etching method, an anisotropic dry etching may be conducted to carry out the dry etching, and a mixed gas of $Cl_2/BCl_3/Ar$ gases may be used as an etchant. Then, the resist layer is subject to an ashing removal, and the resist layer is removed by washing with an organic removing solution. In this manner, the conductive layer is processed so that the first wiring layer 30 is formed.

(2) Formation of Second Interlayer Dielectric Layer

Figure 4:
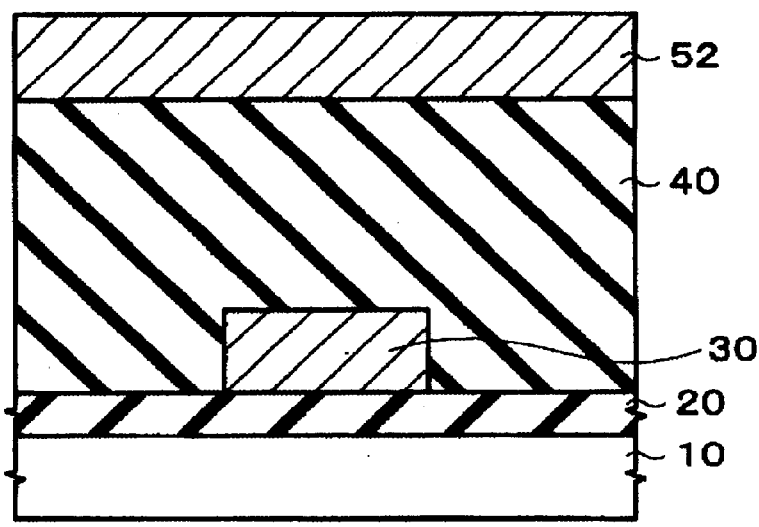
FIG. 4 schematically show in cross section a step for manufacturing the semiconductor device in accordance with an embodiment of the present invention.

As shown in FIG. 4, a second interlayer dielectric layer 40 is formed over the first wiring layer 30 and the first interlayer dielectric layer 20 in a manner to cover the first wiring layer 30 in the following manner. The second interlayer dielectric layer 40 is obtained through forming, first, an FSG (Fluorine-doped Silicate Glass) by a high-density plasma CVD method, and depositing thereon in layers a TEOS oxide layer by a plasma CVD method. The film thickness of the FSG film is about 400 nm, and the film thickness of the TEOS oxide layer is about 1000 nm. Then, a planarization step is conducted by a CMP method until the film thickness of the second interlayer dielectric layer 40 becomes about 550 nm.

The film thickness of the second interlayer dielectric layer 40 may preferably be 400–2500 nm measured from a top surface of the first wiring layer 30 as a reference before the planarization, and may preferably be 400–2000 nm after the planarization.

As other materials for the second interlayer dielectric layer 40, silicon oxide, silicon oxide including phosphorous or the like may be used.

The second interlayer dielectric layer 40 may be formed by, in addition to the above-described method, a thermal CVD method, a plasma CVD method, a normal pressure CVD method, a coating method such as a spin coat method (using SOG), a sputter method, and a thermal vacuum deposition method.

(3) Formation of Conductive Layer for Second Wiring Layer

As shown in FIG. 4, a second conductive layer 52 for a second wiring layer 50 is formed on the second interlayer dielectric layer 40. Its film thickness, material and forming method may be the same as those for the first conductive layer.

(4) Formation of Through Hole

Figure 5:
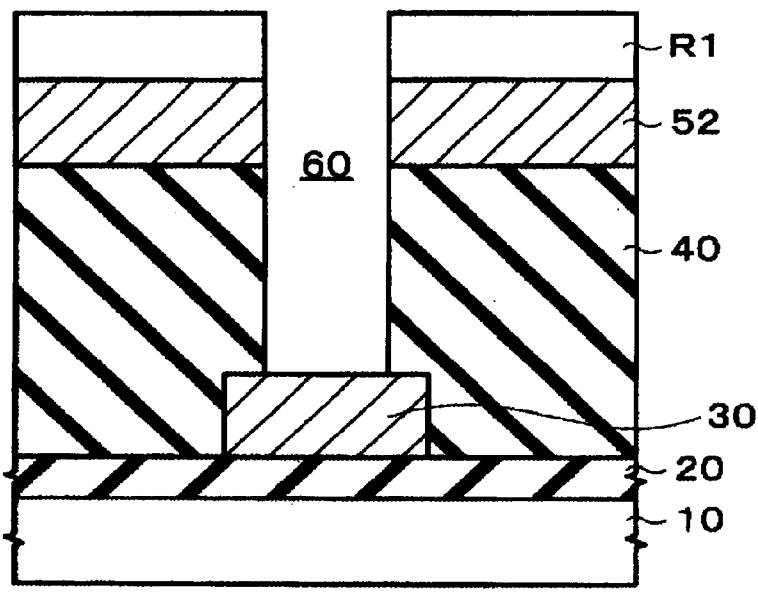
FIG. 5 schematically show in cross section a step for manufacturing the semiconductor device in accordance with an embodiment of the present invention.
Figure 6:
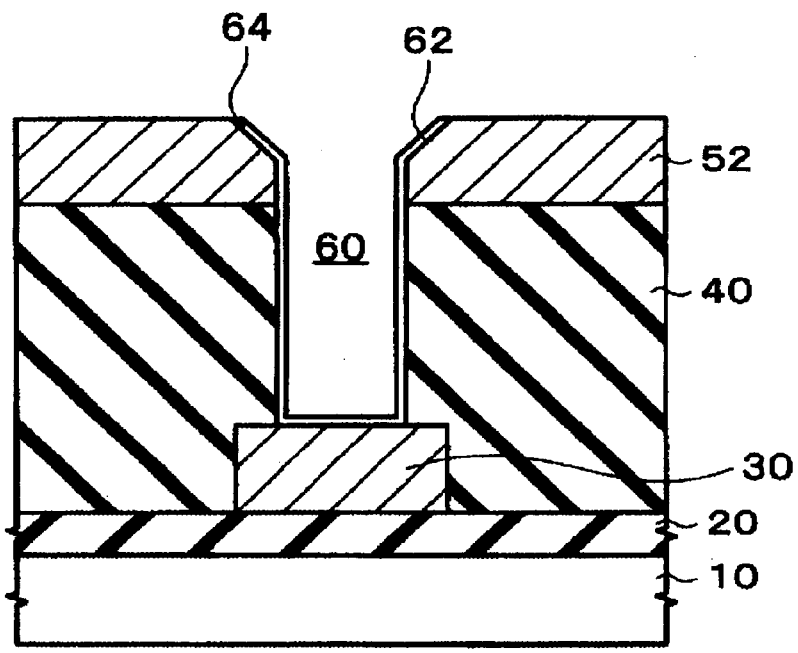
FIG. 6 schematically show in cross section a step for manufacturing the semiconductor device in accordance with an embodiment of the present invention.

Next, as shown in FIG. 5, a resist layer R1 having a specified pattern is formed on the second conductive layer 52 by a lithography technique. The resist layer R1 has an opening section above the first wiring layer 30. In other words, the resist layer R1 has a opening section above a region of the second conductive layer 52 where a through hole 60 is to be formed.

Next, by using the resist layer R1 as a mask, the second conductive layer 52 and the second interlayer dielectric layer 40 are etched, for example, by the following method, to form the through hole 60.

First, the second conductive layer 52 is etched (hereafter referred to as "first etching"). The first etching is conducted until the upper surface of the second interlayer dielectric layer 40 is exposed. This etching is conducted by an anisotropic dry etching, and a mixed gas of $Cl_2/BCl_3/Ar$ gases is used as an etchant. In addition, embodiment examples of dry etching include a reactive ion etching, an inductive coupling type plasma etching, and an ECR plasma etching. Any etchant may be used as long as it can etch the second conductive layer 52, and may be a mixed gas of gases including chlorine family gas. The chlorine family gas may preferably be at least one type selected from $Cl_2$ and $BCl_3$. Also, the mixed gas of gases including chlorine family gas may include at least one type selected from Ar, $CH_4$, $CHF_3$ and $N_2$.

Then, the second interlayer dielectric layer 40 is continuously etched (hereafter referred to as "second etching"). The second etching is conducted until the top surface of the first wiring layer 30 is exposed. The second etching is conducted by an anisotropic dry etching, and a mixed gas of $C_4F_8/O_2/Ar/CO$ gases is used as an etchant. The second interlayer dielectric layer 40 may be etched by a reactive ion etching. Any etchant may be used as long as it can etch the second interlayer dielectric layer 40, and may be for example a mixed gas of gases including CF family gas. The CF family gas may preferably be at least one type selected from $CF_4$, $CHF_3$, $C_2F_6$, $C_4F_8$ and $C_5F_8$. Also, the mixed gas of gases including CF family gas may include at least one type selected from CO, Ar, $O_2$ and $N_2$.

In the manner described above, the through hole 60 that penetrates through the second conductive layer 52 and the second interlayer dielectric layer 40 can be formed.

(5) Pre-Processing for Forming Contact Layer

Next, after the resist layer R1 is removed by ashing, a sputter etching with argon ions is conducted as a pre-processing step prior to forming a contact layer 70 in the through hole 60.

By conducting this pre-processing, naturally oxidized films that are formed on the surface of the first wiring layer 30 and on the surface of the second interlayer dielectric layer 40 that defines the side surface of the through hole 60 are removed to provide clean wiring surfaces without contaminant impurities. As a result, good electrical contacts with a contact layer 70 to be formed later can be obtained. Also, the sputter etching is a physical etching, and thus cuts the opening section of the through hole 60 formed in the second wiring layer 50 to thereby provide a tapered side surface 62, which securely provides electrical contacts with the contact layer 70. Besides the sputter etching, a chemical dry etching may be conducted.

(6) Formation of Contact Layer

Next, the contact layer 70 is formed in the through hole 60 by the following method.

This process is conducted continuously without exposing the wafer to the atmosphere after the completion of the process in the step (5) described above. First, a wetting layer and a barrier layer 64 are formed in the through hole 60. The wetting layer is formed by a sputter method, and its material is preferably titanium. The barrier layer is preferably composed of a titanium nitride that is formed by a CVD method using TDMAT (Tetrakis Di-Methyl Amino Titanium) as raw material gas.

Figure 7:
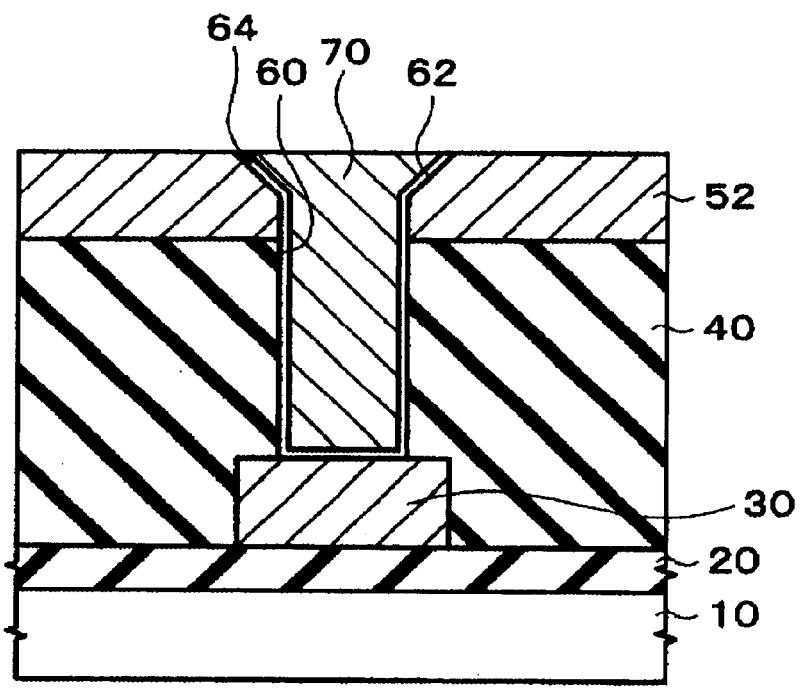
FIG. 7 schematically show in cross section a step for manufacturing the semiconductor device in accordance with an embodiment of the present invention.

Next, as shown in FIG. 7, a conductive material is embedded in the through hole 60. The conductive material is preferably tungsten, and is formed by a CVD method using $WF_6$ as raw material gas. Then, the conductive material formed over the conductive layer 52 for the second wiring layer is removed by a CMP method or an etching back method. For the etching back method, a dry etching may be conducted using $SF_6/Ar$ gases.

In addition to tungsten described above, aluminum, aluminum alloy, copper and copper alloy are examples of other materials which may be used as the conductive material. The method for filling through hole 60 with the conductive material may include, for example, in addition to the CVD method, a PVD method and a plating method.

(7) Formation of Second Wiring Layer

Next, a second wiring layer 50 is formed from the conductive layer 52 in the following manner. First, a resist layer having a specified pattern is formed by a lithography technique. Then, by using the resist layer as a mask, the second conductive layer 52 is etched, to thereby form the second wiring layer 50. The etching is conducted with an anisotropic dry etching, and a mixed gas of $Cl_2/BCl_3/Ar$ gases may be used as an etchant. Then, after the resist layer is removed by ashing, it is washed with an organic removing solution. In this manner, the semiconductor device 100 is completed.

The second wiring layer 50 can be formed by, besides the method in which the resist layer is formed and patterned, a method using a hard mask. An embodiment example thereof is described below.

First, a NSG (Non-doped Silicate Glass) film is formed, and a pattern is formed by a lithography technique. The NSG film is formed by a plasma CVD method using TEOS gas as a raw material, and has a film thickness of about 250 nm. Next, the NSG film is etched to form a hard mask. This etching may be conducted by an anisotropic dry etching, and a mixed gas of $C_4H_8/O_2/Ar/CO$ gases may be used as an etchant. Then, after the resist layer is removed by ashing, it is washed with an organic removing solution. Then, by using the hard mask thus formed, the second conductive layer 52 is etched. The etching is conducted by an anisotropic dry etching, and a mixed gas of $Cl_2/BCl_3/Ar/CHF_3/N_2$ gases is used as an etchant. Then, in order to remove reaction products of the etching process, an ashing removal process is conducted, and then it is washed with an organic removing solution.

In accordance with the illustrated embodiments, the through hole 60 that penetrates through the second wiring layer 50 and the second interlayer dielectric layer 40 is formed. Also, when the patterning of the second wiring layer 50 is conducted after forming the contact layer 70 inside the through hole 60, a portion thereof wider than a specified diameter is removed, at the upper end section of the through hole 60.

Figure 8:
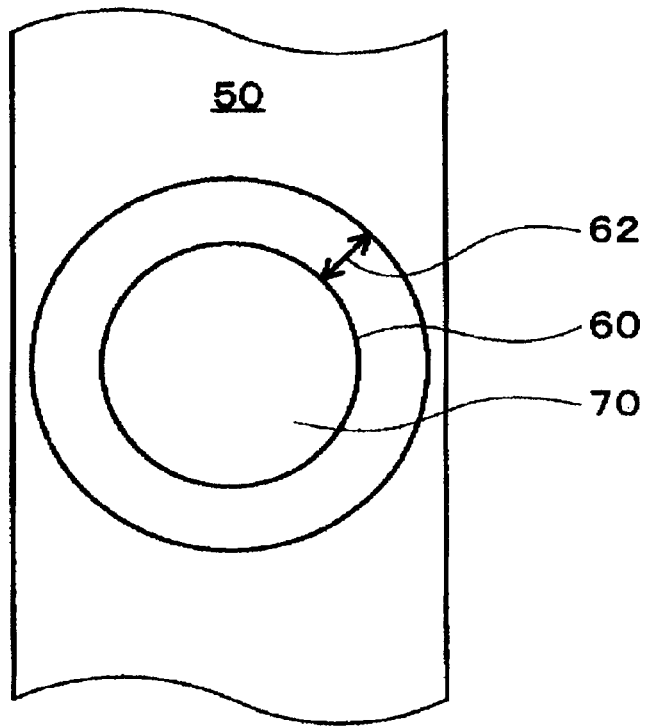
FIG. 8 schematically shows a plan view of a semiconductor device in accordance with an embodiment of the present invention.

The through hole 60 may have a configuration shown in FIG. 8, in addition to the one described above. FIG. 8 schematically shows a plan view of the second wiring layer 50. The through hole 60 has a tapered side surface 62, and the diameter of its upper end section is wider than a specified diameter, but is formed within a region of the second wiring layer 50, such that the contact layer 70 is not removed.

It is noted that, in the illustrated embodiments, the description was made as to the contact layer that connects the first wiring layer over the first interlayer dielectric layer to the second wiring layer over the second interlayer dielectric layer. However, the present invention is not limited to this configuration, and can be applied to contact layers that electrically connect different layers other than the above.

In addition, it will be understood that a variety of additional modifications may be made to the embodiments described above within the scope of the present invention.

What is claimed:

1. A semiconductor device comprising:
   a first wiring layer;
   an interlayer dielectric layer formed above the first wiring layer;
   a second wiring layer formed above the interlayer dielectric layer;
   a through hole formed in the second wiring layer and the interlayer dielectric layers, wherein a side surface of the through hole at a position in the second wiring layer has a taper such that a diameter of the through hole at the position in the second wiring layer is greater than a diameter of the through hole at a position in the interlayer dielectric layer; and
   a contact layer that is formed in the through hole and electrically connects the first wiring layer and the second wiring layer.

2. A semiconductor device according to claim 1, wherein a side surface of the through hole formed in the interlayer dielectric layer is continuous with the side surface of the through hole formed in the second wiring layer.

3. A semiconductor device according to claim 1, wherein the contact layer includes a protruded section that protrudes above a top surface of the interlayer dielectric layer, and the contact layer and the second wiring layer are electrically connected to each other through a side surface of the protruded section.

4. A semiconductor device according to claim 1, wherein an upper surface of the contact layer and an upper surface of the second wiring layer are at approximately the same height in the device.

5. A semiconductor device according to claim 1, wherein at least one of a wetting layer and a barrier layer is formed inside the through hole formed in the interlayer dielectric layer, and at least one of the wetting layer and the barrier layer extends to a side surface of the through hole formed in the second wiring layer.

6. A semiconductor device according to claim 5, wherein the contact layer and the second wiring layer are electrically connected to each other through at least one of the wetting layer and the barrier layer.

7. A semiconductor device according to claim 1, wherein a side surface of the contact layer and a surface of the second wiring layer are electrically connected to each other through a wetting layer and a barrier layer.

8. A method for manufacturing a semiconductor device, comprising the steps:
   (a) forming a first wiring layer;
   (b) forming an interlayer dielectric layer above the first wiring layer;
   (c) forming a conductive layer above the interlayer dielectric layer;
   (d) forming a through hole in the conductive layer and the interlayer dielectric layer, wherein the through hole reaches the first wiring layer, and etching the through hole to form a taper on a side surface of the through hole at a position in the conductive layer such that a diameter of the through hole at the position in the conductive layer is greater than a diameter of the through hole at a position in the interlayer dielectric layer;
   (e) forming a contact layer in the through hole; and
   (f) patterning the conductive layer to form a second wiring layer.

9. A method for manufacturing a semiconductor device according to claim 8, wherein, in the step (d), the through hole is formed such that a side surface of the through hole formed in the conductive layer and a side surface of the through hole formed in the interlayer dielectric layer are continuous with each other.

10. A method for manufacturing a semiconductor device according to claim 8, wherein the step (e) includes the step of forming a contact layer in the through hole and above the conductive layer, and further comprising, before the step (f), the step (g) of removing the contact layer formed above the conductive layer.

11. A method for manufacturing a semiconductor device according to claim 10, wherein, in the step (g), an upper surface of the contact layer and an upper surface of the second wiring layer are formed to have approximately the same height.

12. A method for manufacturing a semiconductor device according to claim 8, further comprising, before the step (e), the step (h) of forming at least one of a wetting layer and a barrier layer in the through hole formed in the interlayer dielectric layer.

13. A method for manufacturing a semiconductor device according to claim 12, wherein, in the step (h), at least one of the wetting layer and the barrier layer is formed to extend to a side surface of the through hole formed in the conductive layer.

14. A method for manufacturing a semiconductor device according to claim 8, wherein the etching removes impurity contaminants.

15. A semiconductor device comprising:
   a first electrically conducting layer;
   an interlayer dielectric layer formed on the first electrically conducting layer;
   a second electrically conducting layer formed on the interlayer dielectric layer;
   a through hole extending through the second electrically conducting layer and the interlayer dielectric layer, wherein the through hole has a tapered side surface such that a width of the through hole at a first position in the second electrically conducting layer is greater than a width of the through hole at a second position in the second electrically conducting layer; and
   a third electrically conducting layer that is disposed in the through hole, wherein the third electrically conducting layer is in electrical contact with the first electrically conducting layer and the second electrically conducting layer.

16. A semiconductor device as in claim 15, wherein at least one of a barrier layer and a wetting layer is formed in the through hole prior to forming the third electrically conducting layer in the through hole.

17. A semiconductor device as in claim 16, wherein the third electrically conducting layer has a composition that is different than that of the second electrically conducting layer.

18. A semiconductor device as in claim 15, further comprising a layer of TiN and a layer of Ti in the through hole.

19. A semiconductor device as in claim 15, wherein the tapered side surface of the through hole extends from an upper region in the second electrically conducting layer wiring layer to a lower region in the electrically conducting layer, and wherein the through hole has a constant width in the dielectric layer.

20. A method for manufacturing a semiconductor device according to claim 8, wherein the taper is formed to extend from an upper position in the conductive layer above the interlayer dielectric layer to a lower position in the conductive layer above the interlayer dielectric layer.

21. A method for manufacturing a semiconductor device according to claim 8, further comprising, prior to forming the contact layer in the through hole, forming a Ti layer and a TiN layer in the through hole.

22. A semiconductor device as in claim 1, further comprising a layer of Ti and a layer of TiN in the through hole.

23. A method for manufacturing a semiconductor device, comprising the steps:

forming a first conductive layer;

forming an interlayer dielectric layer above the first wiring layer;

forming a second conductive layer above the interlayer dielectric layer;

forming a through hole through the second conductive layer and the interlayer dielectric layer, wherein the through hole reaches the first wiring layer, and etching the through hole to the to form a tapered side surface such that a width of the through hole at a first position in the second electrically conducting layer is greater than a width of the through hole at a second position in the second electrically conducting layer; and forming a contact layer in the through hole to electrically connect the first conductive layer and the second conductive layer.

* * * * *